United States Patent
Torii

(10) Patent No.: US 12,362,744 B2
(45) Date of Patent: Jul. 15, 2025

(54) SEMICONDUCTOR DEVICE

(71) Applicant: SANKEN ELECTRIC CO., LTD., Niiza (JP)

(72) Inventor: Katsuyuki Torii, Tokyo (JP)

(73) Assignee: SANKEN ELECTRIC CO., LTD., Niiza (JP)

( * ) Notice: Subject to any disclaimer, the term of this patent is extended or adjusted under 35 U.S.C. 154(b) by 904 days.

(21) Appl. No.: 17/534,496

(22) Filed: Nov. 24, 2021

(65) Prior Publication Data

US 2023/0163760 A1    May 25, 2023

(51) Int. Cl.
| H03K 17/567 | (2006.01) |
| H10D 1/47 | (2025.01) |
| H10D 12/00 | (2025.01) |
| H10D 84/60 | (2025.01) |

(52) U.S. Cl.
CPC ............. *H03K 17/567* (2013.01); *H10D 1/47* (2025.01); *H10D 12/481* (2025.01); *H10D 84/615* (2025.01)

(58) Field of Classification Search
CPC ...... H03K 17/567; H10D 1/47; H10D 12/481; H10D 84/615
USPC ................................. 327/108, 109, 432, 479
See application file for complete search history.

(56) References Cited

U.S. PATENT DOCUMENTS

| 5,986,484 | A | * | 11/1999 | Kimata | .............. | H03K 17/0828 |
| | | | | | | 327/108 |
| 2002/0057114 | A1 | * | 5/2002 | Kim | ...................... | H03K 17/168 |
| | | | | | | 327/108 |
| 2012/0280728 | A1 | * | 11/2012 | Hussein | ............... | H03K 17/127 |
| | | | | | | 327/155 |
| 2016/0182034 | A1 | * | 6/2016 | Wagoner | .............. | H03K 17/567 |
| | | | | | | 327/432 |
| 2017/0019097 | A1 | * | 1/2017 | Sato | ...................... | H10D 84/403 |
| 2023/0006552 | A1 | * | 1/2023 | Hiyama | ............... | H02M 1/0009 |
| 2025/0093391 | A1 | * | 3/2025 | Tarmoom | ................ | G01R 1/203 |
| 2025/0096794 | A1 | * | 3/2025 | Udrea | ................... | H03K 17/687 |

FOREIGN PATENT DOCUMENTS

JP    2013-098415 A    5/2013

* cited by examiner

*Primary Examiner* — William Hernandez
(74) *Attorney, Agent, or Firm* — METROLEX IP LAW GROUP, PLLC; Robert L. Scott, Esq.

(57) ABSTRACT

A semiconductor device according to one or more embodiments may include a drive circuit comprising: a gate control circuit that generates a gate control signal; a first resistor comprising a first electrode electrically connected to the gate control circuit and a second electrode; and a second resistor comprising a first electrode electrically connected to the gate control circuit and a second electrode that is not electrically connected to the second electrode of the first resistor; wherein the second resistor comprises a resistance value greater than that of the first resistor; an IGBT circuit comprising: a first IGBT cell electrically connected to the second electrode of the first resistor; and a second IGBT cell electrically connected to the second electrode of the second resistor.

6 Claims, 5 Drawing Sheets

A-A

SEMICONDUCTOR DEVICE

BACKGROUND

In power semiconductor device technology, IGBTs (Insulated Gate Bipolar Transistor) are capable of low ON voltage by the effect of conductivity modulation, but a tail current flow might be a problematic since tail current continues to flow until a residual carrier at the time of conductivity modulation disappears when turning off. This makes it difficult to achieve a fast-switching operation. As a countermeasure to reduce the tail current, it has been known to introduce a crystal defect in a drift region and capture a residual carrier by the carrier trap effect. However, a leakage current increases due to the introduction of a crystal defect in this method.

Japanese Patent Publication 2013-98415 (Patent Document 1) proposes a method of dividing gate electrodes of an IGBT into a control gate and a normal gate and inputting OFF signals of different timings to each of the gate electrodes (control gate and normal gate) as a countermeasure against the tail current. In a semiconductor device of Patent Document 1, the control gate is first turned off before the normal gate is turned off, and the hole carrier density at the time of conductivity modulation of the semiconductor device is made lower than that of the conventional semiconductor device before the normal gate is turned off. After that, the normal gate is turned off. As a result, the residual hole carrier density, which causes the tail current immediately after the normal gate is turned off, can be lowered compared with the conventional method, and therefore, an IGBT, which is turned off with high speed, can be achieved.

In this case, however, not only the IGBT needs to be changed, but also it might be necessary to have a function to output independent gate signals with different timings to a control circuit, such as an IC. The conventional simple control circuit also needs to have significant changes and additional functions.

SUMMARY

A semiconductor device according to one or more embodiments may include a drive circuit comprising: a gate control circuit that generates a gate control signal; a first resistor comprising a first electrode electrically connected to the gate control circuit and a second electrode; and a second resistor comprising a first electrode electrically connected to the gate control circuit and a second electrode that is not electrically connected to the second electrode of the first resistor; wherein the second resistor comprises a resistance value greater than that of the first resistor; an IGBT circuit comprising: a first IGBT cell electrically connected to the second electrode of the first resistor; and a second IGBT cell electrically connected to the second electrode of the second resistor.

DETAILED DESCRIPTION

Figure 1:
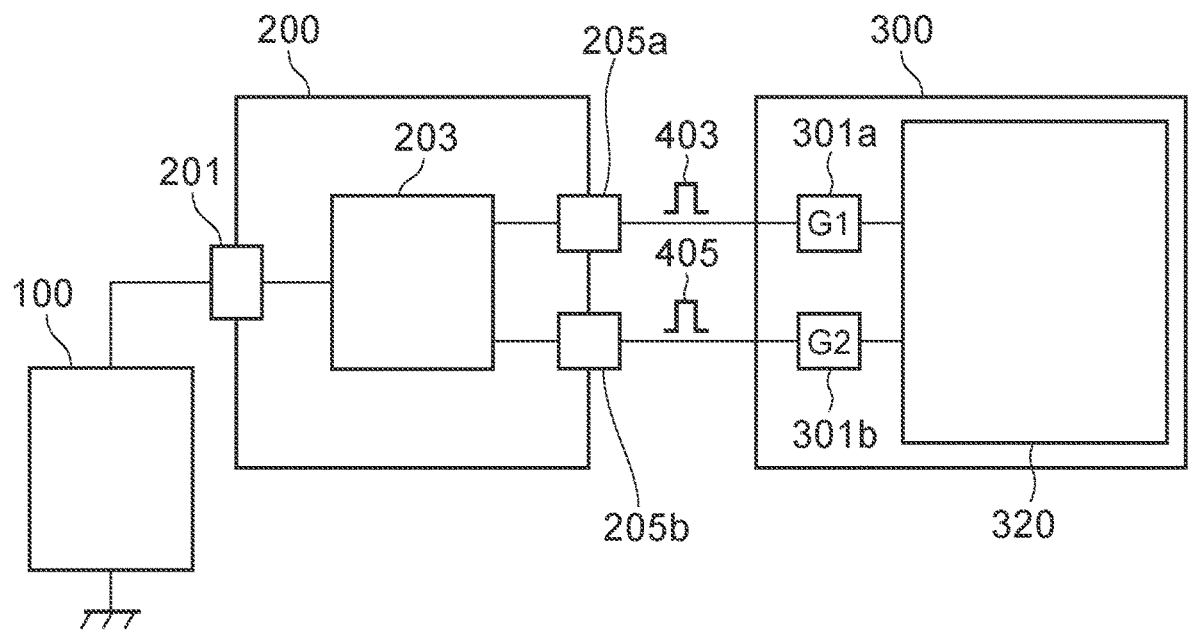
FIG. 1 is a diagram illustrating a semiconductor device according to one or more embodiments.

One or more embodiments are described in detail with reference to drawings. In the following descriptions of drawings, the same or similar parts may be indicated by the same or similar indications. The descriptions of drawings are schematic, and the relationship between thickness and dimensions, the ratio of thickness of each layer, etc. are examples and do not limit the technical concept of the invention. The relationship between dimensions and the ratio of dimensions may differ from each other among the drawings. The following embodiments explains a condition where exemplary a first conductivity type is n-type and a second conductivity type is p-type, but it may be possible to select the conductivity types in the opposite relationship, where the first conductivity type is p-type and the second conductivity type is n-type. In the following descriptions when explaining the positional relationship of components, "top", "bottom", "right side", "left side", etc. are used as necessary based on an orientation of the referenced drawing, but these indications do not limit the technical concept of the invention. "Top", "bottom", "right side", "left side", etc. may be used without the parts touching each other. The X-axis, Y-axis, or Z-axis may be used in the drawings to explain directions. In diagrams, the "width direction" may mean the X direction or the direction opposite to the X direction in the figure. The "depth direction" or "lower side" may mean the Y direction illustrated in the figure. The "shallow direction" or "upper side" may mean the direction opposite to the Y direction illustrated in the figure. The "longitudinal direction" may mean the Z direction or the direction opposite to the Z direction illustrated in the figure.

FIG. 1 is a diagram illustrating a semiconductor device one or more embodiments. FIG. 1 illustrates a power supply 100, a drive circuit 200 that inputs a predetermined voltage from the power supply 100, and an IGBT circuit 300 that inputs a control signal output from the drive circuit 200. The power supply 100 supplies a predetermined voltage to the drive circuit 200. There is no restriction on the voltage supplied, and for example, an input voltage of 15V may be used. The drive circuit 200 includes a gate control signal generator 203. The drive circuit 200 may also include a voltage input pad 201, a control gate control signal output pad 205a, and a main gate control signal output pad 205b. The power supply 100 is connected to the voltage input pad 201 and supplies an input voltage to the voltage input pad 201. The gate control signal generator 203 detects the voltage supplied to the voltage input pad 201 and generates a control gate control signal 403 and a main gate control signal 405. The control gate control signal 403 and the main gate control signal 405 are signals for controlling the gates of the IGBT circuit 300. The generated control gate control signal 403 is output to the control gate control signal output pad 205a. The generated main gate control signal 405 is output to the main gate control signal output pad 205b. The IGBT circuit 300 includes a control gate pad 301a, a main gate pad 301b, and an active region 320. The control gate pad 301a is electrically connected to the control gate 337 of control IGBTs in the active region 320. The main gate pad 301b is electrically connected to main IGBTs in the active region 320. In FIG. 1, the control gate pad 301a and the main gate pad 301b are each electrically connected to the active region 320 by a bus line, but this is not limited thereto. The control gate pad 301a and the main gate pad 301b may be arranged in an inactive part of the semiconductor device. Traditionally, a semiconductor device includes an active region in which various elements are formed and an inactive region provided on the peripheries of the active region. The drive circuit 200 and the IGBT circuit 300 may be mounted on one lead-frame or may be mounted on separate lead-frames.

Figure 2:
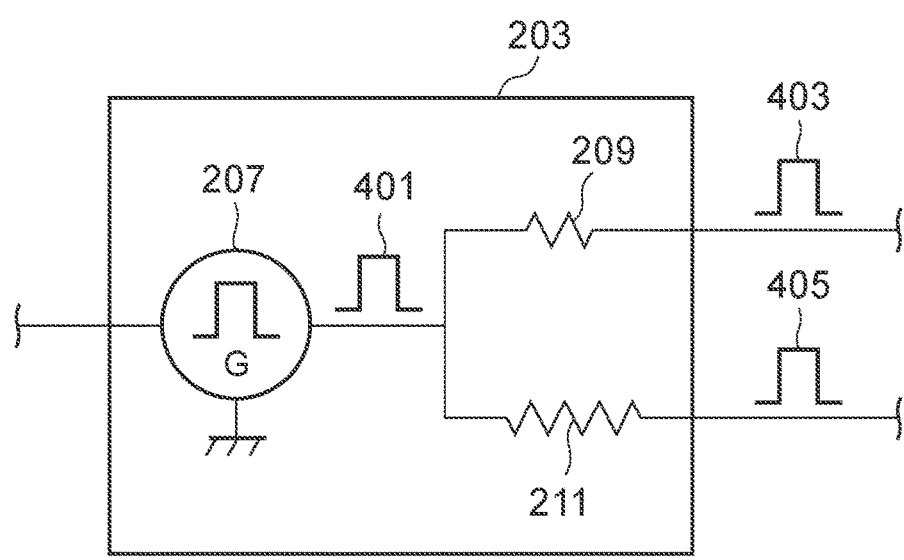
FIG. 2 is a diagram illustrating the gate control signal generator 203 according to one or more embodiments.

FIG. 2 is a diagram illustrating the gate control signal generator 203 according to one or more embodiments. The gate control signal generator 203 includes a gate control circuit 207, a resistor 209, and a resistor 211. The resistor 209 and the resistor 211 may be formed with polysilicon. Resistance values of the resistor 209 and the resistor 211 may be made different.

Figure 3:
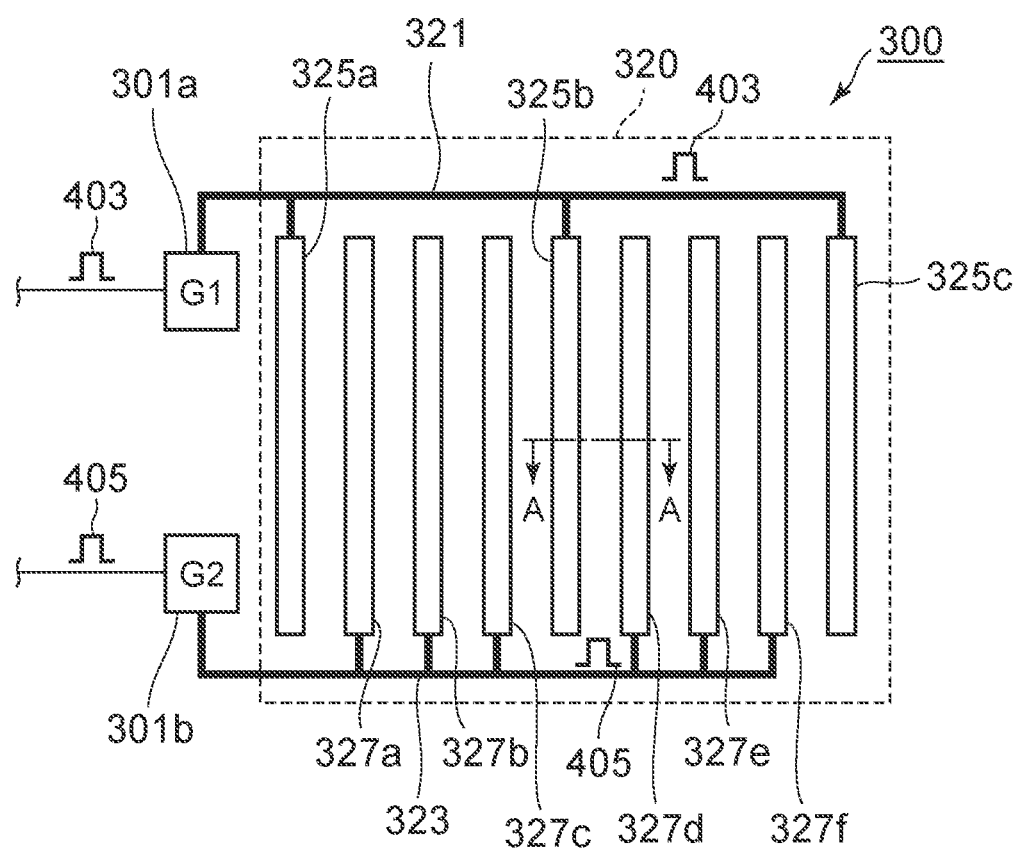
FIG. 3 is a diagram illustrating the IGBT circuit 300 according to one or more embodiments.

FIG. 3 is a diagram illustrating the IGBT circuit 300 according to one or more embodiments. The IGBT circuit 300 includes the control gate pad 301a, the main gate pad 301b, and the active region 320. The control gate pad 301a receives the control gate control signal 403. The main gate pad 301b receives the main gate control signal 405.

The active region 320 includes control gates 325a, 325b, and 325c, and main gates 327a, 327b, 327c, 327d, 327e, and 327f. Each of the control gates 325a, 325b, and 325c is included in a control IGBT cell provided in the active region 320. Each of the main gates 327a, 327b, 327c, 327d, 327e, and 327f is included in a main IGBT cell provided in the active region 320. The control gates 325a, 325b, and 325c are electrically connected to the control gate pad 301a by a control gate bus line 321. The control gates 325a, 325b, and 325c are connected in parallel by the control gate bus line 321. The main gates 327a, 327b, 327c, 327d, 327e, and 327f are electrically connected to the main gate pad 301b by a main gate bus line 323. The main gates 327a, 327b, 327c, 327d, 327e, and 327f are connected in parallel by the main gate bus line 323.

For example, resistance values of the resistor 209 and the resistor 211 may be made different. A control IGBT cell including the control gates 325a, 325b, and 325c and a main IGBT cell including the main gates 327a, 327b, 327c, 327d, 327e, and 327f have different discharge current values from the resistor 209 and the resistor 211 when turned off according to the resistance values of the resistor 209 and the resistor 211. Therefore, for example, when the resistance value of the resistor 209 is small, the discharge on the side of the resistor 209 becomes faster, and the cell of the control IGBT cell on the side connected to the resistor 209 becomes the off-state first. As a result, the hole carrier density at the time of conductivity modulation may be reduced. Then, for example, because the resistance value of the resistor 211 is larger than the resistance value of the resistor 209, the main IGBT cell connected to the resistor 211 side is turned off, when it causes lowering the residual hole carrier density. As a result, tail current countermeasures may be conducted. The gate control signal generator 203 may use an existing circuit. The IGBT circuit 300 may be easily manufactured and may be incorporated under existing conditions in the assembly process.

As in the IGBT circuit 300 illustrated in FIG. 3, the number of main gates 327 may be more than the number of control gates 325. The control IGBT cell with the control gates 325 and the main IGBT cell with the main gates 327 may be arranged alternately, and the main IGBT cell with the main gate 327 may be provided between the control IGBT cell with the control gate 325 and the control IGBT cell with the control gates 325. For example, as illustrated in FIG. 3, three main IGBT cells with the main gates 327a, 327b, and 327c may be positioned between the control IGBT cell with the control gate 325a and the control IGBT cell with the control gate 325b. However, it is not limited thereto, two, four, five, six, seven, etc. of the main IGBT cells with main gate may be positioned between the control IGBT cell with a control gate and the control IGBT cell with a control gate. The control gate pad 301a and the main gate pad 301b may be provided in an inactive region of the IGBT circuit 300. A breakdown voltage improvement region (not illustrated in FIG. 3), such as a field limiting ring (FLR), may be provided outside the control gate pad 301a and the main gate pad 301b.

Figure 4:
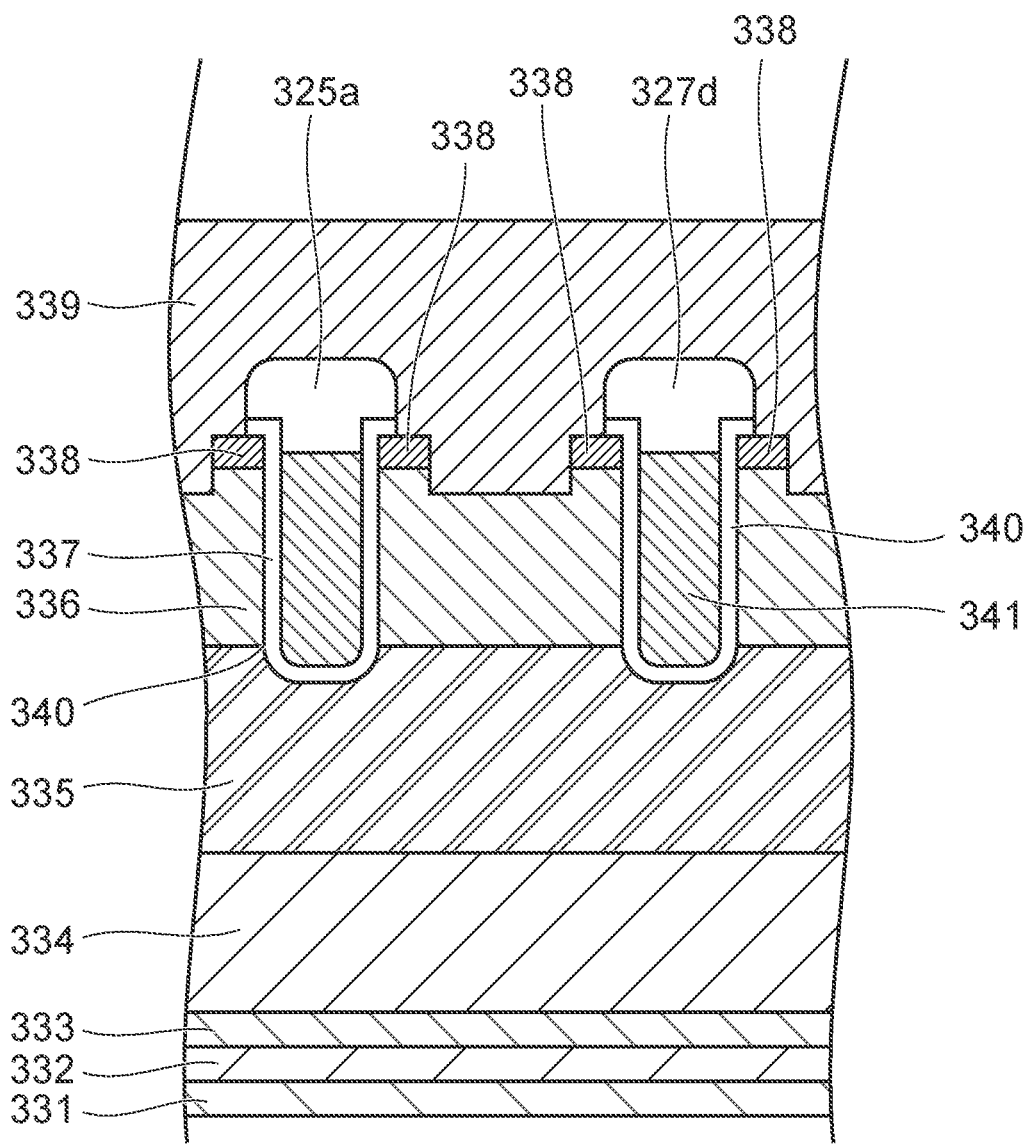
FIG. 4 is a diagram illustrating an A-A cross-sectional view of the IGBT circuit 300, such as illustrated in FIG. 3.

FIG. 4 is a diagram illustrating an A-A cross-sectional view of the IGBT circuit 300 illustrated in FIG. 3, for example. In FIG. 3, the IGBT circuit 300 includes a collector electrode 331, a collector region 332 which is positioned on the collector electrode 331 and is electrically connected to the collector electrode 331, a field stop region 333 positioned on the collector region 332, a drift region 334 positioned on the field stop region 333, a storage carrier layer 335 positioned on the drift region 334, a base region 336 positioned on the storage carrier layer 335, emitter regions 338 provided in contact with the base region 336, an emitter electrode 339 which is positioned on the emitter regions 338, and is electrically connected to the emitter regions 338, a control 337, the control gate 325b which is electrically connected to the control gate electrode 337, a main gate electrode 341, the main gate 327d which is electrically connected to the main gate electrode 341, and gate insulating films 340 which insulate the control gate electrode 337 and the main gate electrode 341. The control gate electrode 337 is insulated from the emitter regions 338, the base region 336, and the storage carrier layer 335 by the gate insulating film 340. The main gate electrode 341 is also insulated from the emitter regions 338, the base region 336, and the storage carrier layer 335 by the gate insulating film 340. The field stop region 333, the drift region 334, the storage carrier layer 335, and the emitter electrode 339 may be a first conductivity type. The impurity concentration of the storage carrier layer 335 may be higher than that of the drift region 334. In FIG. 4, the storage carrier layer 335 is provided, but the storage carrier layer 335 may not be provided. In this case, the impurity concentration of the region corresponding to the storage carrier layer 335 may be equal to the impurity concentration of the drift region 334. The field stop region 333 may have a higher impurity concentration than the storage carrier layer 335. The collector region 332 and the base region 336 may be a second conductivity type. The control gate electrode 337 and the main gate electrode 341 are provided inside a trench provided in the depth direction of the IGBT circuit 300 and are sandwiched between the emitter regions 338. In FIG. 4, the control gate electrode 337 and the main gate electrode 341 may have different characteristics and structures. For example, in FIG. 4, the control gate electrode 337 and the main gate electrode 341 have the same depth, but are not limited thereto. The control gate electrode 337 and the main gate electrode 341 may have different characteristics by making difference in the depth, shape, etc. of the control gate electrode 337 and the main gate electrode 341. The gate insulating film 340 that insulates the control gate electrode 337 and the gate insulating film 340 that insulates the main gate electrode 341 may have different characteristics and structures. For example, the thickness of the gate insulating film 340 that insulates the control gate electrode 337 may be different from the thickness of the gate insulating film 340 that insulates the main gate electrode 341. The control gate control signal 403 (not illustrated in FIG. 4) is input to the control gate 325a. The control IGBT cell with the control gate 325a operates the control gate electrode 337, etc. The main gate control signal 405 (not illustrated in FIG. 4) is input to the main gate 327d. The main IGBT cell with the main gate 327d operates the main gate electrode 341, etc.

Figure 5:
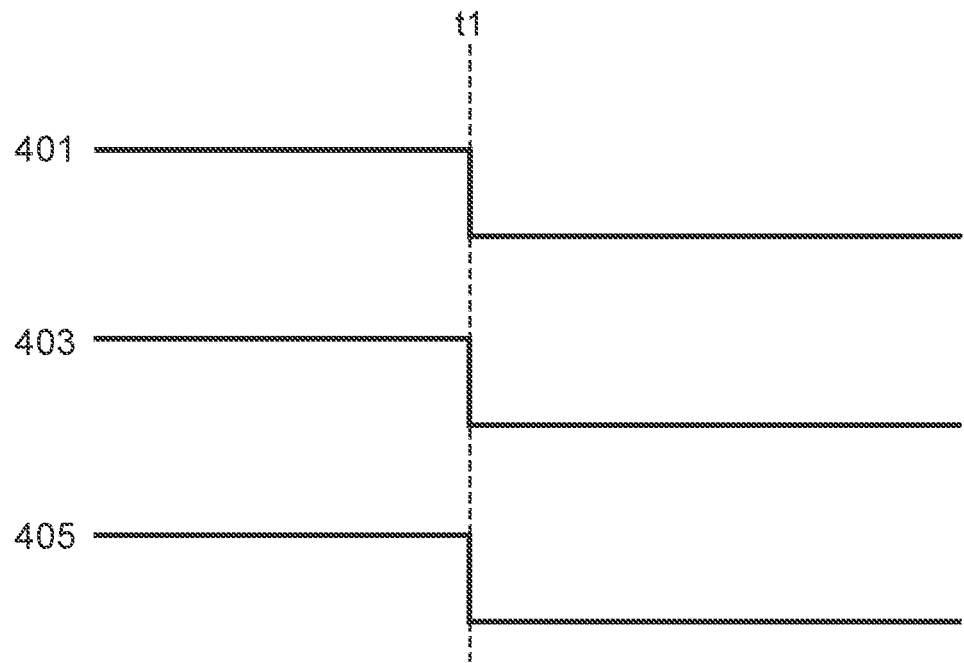
FIG. 5 is a diagram illustrating a timing chart of the gate control signal 401, the control gate control signal 403, and the main gate control signal 405.

FIG. 5 is a diagram illustrating a timing chart of the gate control signal 401, the control gate control signal 403, and the main gate control signal 405. The gate control signal 401, which is output from the gate control circuit 207, transitions from a predetermined on-state to an off-state at time t1. The control gate control signal 403, which is an output of the resistor 303, and the main gate signal 405 transition from a predetermined on-state to the off state at time t1. In other words, the control gate signal 403 and the main gate signal 405 may transition to the off state at the same time as the gate control signal. The voltage in the on-state of the control gate control signal 403 may be a turn-on voltage of the control IGBT cell with the control gates 325a, 325b, and 325c, and the voltage in the off-state of the control gate control signal 403 may be a turn-off voltage of the control IGBT cell with the control gates 325a, 325b, and 325c. The voltage in the on-state of the main gate control signal 405 may be a turn-on voltage of the main IGBT cell with the main gates 327a, 327b, 327c, 327d, 327e, and 327f, and the voltage in the off-state of the main gate control signal 405 may be a turn-off voltage of the main IGBT cell with the main gates 327a, 327b, 327c, 327d and 327e, 327f.

An operation of a semiconductor device according to one or more embodiments are described. First, a predetermined voltage is input to the drive circuit 200 from the power supply 100. The gate control signal generator 203 generates the gate control signal 401 and outputs the gate control signal 401 to the resistor 209 and the resistor 211. The resistor 209 outputs the control gate control signal 403. The resistor 211 outputs the main gate control signal 405. Since the discharge current values from the resistor 209 and the resistor 211 differ according to the resistance value, the discharge on the resistor 209 side with a small resistance value becomes faster, and the control IGBT cell with the control gate electrode 337 on the side connected to the resistor 209 becomes the off-state first.

A positive potential is given to the main gate electrode 341, and the IGBT with the main gate electrode 341 becomes the on-state. At that time, a zero potential is given to the control gate electrode 337, and the IGBT with the control gate electrode 337 remains OFF but turns on later.

Due to the decrease in the storage carriers described above, the slope of dv/dt at the time of turning off becomes steep, and recombination is promoted to give an electron from the emitter electrode 339 of the IGBT provided with the control gate electrode 337 to the holes in the un-depleted region; therefore, the tail current is improved.

Figure 6:
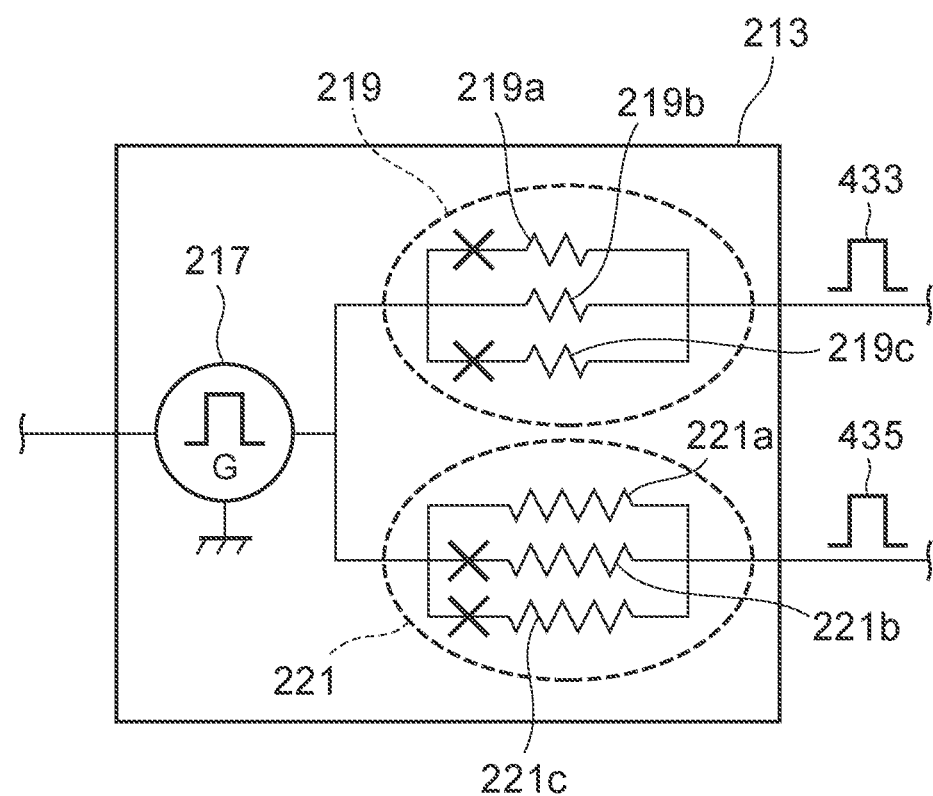
FIG. 6 is a diagram illustrating a gate control signal generator 213 according to one or more embodiments.

FIG. 6 is a diagram illustrating a gate control signal generator 213 according to one or more embodiments. The gate control signal 401 output from the gate control circuit 217 is input to a resistor section 219 and a resistor section 221. The resistor section 219 has a plurality of resistors connected in parallel and includes a resistor 219a, a resistor 219b, and a resistor 219c. The resistors 219a, 219b, and 219c may have different resistance values. The resistor section 221 has a plurality of resistors connected in parallel and includes a resistor 221a, a resistor 221b, and a resistor 221c. The resistors 221a, 221b, and 221c may have different resistance values. The resistor section 219 and the resistor section 221 are each connected in parallel with three resistors, but are not limited thereto. For example, the resistor section 219 and the resistor section 221 may have two, four, five, six, or more resistors connected in parallel. The resistor section 219 and the resistor section 221 may be formed on the surface side of the semiconductor substrate by wiring formed with polysilicon in a trench in which an S-shape is formed many times in a plan view.

The resistor section 219 and the resistor section 221 include a plurality of resistors with different resistance values. By using a resistor with an optimum resistance value, the cell of the IGBT circuit 300 may control the timing of turning off, and the decrease in the hole carrier density at the time of the conductivity modulation of the control gate may be controlled more. The hole carrier density may be lowered by turning off the main cell connected to the resistor section 221 side.

A setting of resistance values of the resistor section 219 and the resistor section 221 with a plurality of resistors with different resistance values is described. For example, as illustrated in FIG. 6, a plurality of resistors may be built in at the time of manufacture. Regarding the plurality of resistors, a resistive part having a resistor for a desired control gate and a resistor for a main gate may be completed by a trimming process in which an excessive current is forcibly applied at an inspection stage of a wafer and a part of a circuit is melted down and made invalid. For example, in FIG. 6, the resistor section 219 includes the resistor 219a, the resistor 219b, and the resistor 219c. However, the trimming process disables the resistor 219a and the resistor 219c, and enables the connection of only the resistor 219b. Also, the resistor section 221 includes the resistor 221a, the resistor 221b, and the resistor 221c. However, the trimming process disables the resistor 221b and the resistor 221c, and enables the connection of only the resistor 221a. As a result, a more optimal resistance value is selected. As described above, by performing the trimming process, it may be easy to respond to the desired operating frequency of the IGBT in the end-use equipment while minimizing changes in conditions in the IGBT making process, changes in the glass mask, etc.

Although one or more embodiments as described above herein may be directed to devices having a particular arrangement of layers with conductivity types, e.g. N, N+, P, and so on, other embodiments may be directed to devices in which the conductivity types are reversed or otherwise modified. Furthermore, the above-described aspects may be combined with each other as practicable within the contemplated scope of embodiments. The above-described embodiments are to be considered in all respects as illustrative, and not restrictive. The illustrated and described embodiments may be extended to encompass other embodiments in addition to those specifically described above without departing from the intended scope of the invention. The scope of the invention is to be determined by the appended claims when read in light of the specification including equivalents, rather than solely by the foregoing description. Thus, all configurations including configurations that fall within equivalent arrangements of the claims are intended to be embraced in the invention.

The invention claimed is:
1. A semiconductor device, comprising:
 a drive circuit comprising:
  a gate control circuit that generates a gate control signal;

a first resistor comprising a first electrode electrically connected to the gate control circuit and a second electrode; and a second resistor comprising a first electrode electrically connected to the gate control circuit and a second electrode that is not electrically connected to the second electrode of the first resistor; wherein the second resistor comprises a resistance value greater than that of the first resistor; and an IGBT circuit comprising:

a first IGBT cell electrically connected to the second electrode of the first resistor; and a second IGBT cell electrically connected to the second electrode of the second resistor, wherein the gate control circuit is mounted on a first semiconductor chip, and the IGBT circuit is mounted on a second semiconductor chip different from the first semiconductor chip.

2. The semiconductor device according to claim 1, wherein the first resistor and the second resistor comprise polysilicon.

3. The semiconductor device according to claim 1, wherein the first resistor comprises resistors that are connected in parallel.

4. The semiconductor device according to claim 1, wherein the second resistor comprises resistors that are connected in parallel.

5. A semiconductor device, comprising:

a drive circuit comprising:

a gate control circuit that generates a gate control signal;

a first resistor comprising a first electrode electrically connected to the gate control circuit and a second electrode; and a second resistor comprising a first electrode electrically connected to the gate control circuit and a second electrode that is not electrically connected to the second electrode of the first resistor; wherein the second resistor comprises a resistance value greater than that of the first resistor;

an IGBT circuit comprising:

a first IGBT cell electrically connected to the second electrode of the first resistor; and a second IGBT cell electrically connected to the second electrode of the second resistor, wherein the gate control signal is split and input to the first resistor and the second resistor.

6. The semiconductor device of claim 5, wherein the IGBT circuit further comprises:

a collector electrode;

a collector region arranged on the collector electrode and electrically connected to the collector electrode;

a field stop region arranged on the collector region;

a drift region arranged on the field stop region;

a base region arranged on the drift region;

an emitter region arranged on the base region;

an emitter electrode arranged on the emitter region and electrically connected to the emitter region;

a main gate electrode arranged insulated from the base region via an insulating film; and a control gate electrode arranged insulated from the base region via the insulating film, wherein the first IGBT cell comprises the main gate electrode, and the second IGBT cell comprises the control gate electrode.

* * * * *